US 011373913B2

(12) United States Patent
Pandey et al.

(10) Patent No.: US 11,373,913 B2
(45) Date of Patent: Jun. 28, 2022

(54) METHOD OF FORMING AN ARRAY OF VERTICAL TRANSISTORS

(71) Applicant: Micron Technology, Inc., Boise, ID (US)

(72) Inventors: Deepak Chandra Pandey, Uttarakhand (IN); Haitao Liu, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 16/558,928

(22) Filed: Sep. 3, 2019

(65) Prior Publication Data

US 2021/0066135 A1 Mar. 4, 2021

(51) Int. Cl.
*H01L 29/66* (2006.01)
*H01L 21/8238* (2006.01)
(Continued)

(52) U.S. Cl.
CPC .. *H01L 21/823487* (2013.01); *H01L 21/8239* (2013.01); *H01L 21/823412* (2013.01); *H01L 21/823418* (2013.01); *H01L 21/823437* (2013.01); *H01L 21/823475* (2013.01); *H01L 21/823885* (2013.01); *H01L 23/528* (2013.01); *H01L 27/10841* (2013.01); *H01L 27/1159* (2013.01); *H01L 27/11507* (2013.01); *H01L 27/2454* (2013.01); *H01L 29/0847* (2013.01); *H01L 29/1037* (2013.01); *H01L 29/785* (2013.01); *H01L 29/7827* (2013.01); *H01L 29/78642* (2013.01); *H01L 29/7926* (2013.01);
(Continued)

(58) Field of Classification Search
CPC ......... H01L 21/823885; H01L 29/7926; H01L 29/785; H01L 29/0847; H01L 29/1037; H01L 29/7827; H01L 29/78642; H01L 27/11507; H01L 27/1159; H01L 27/2454; H01L 27/10841; H01L 21/8239; H01L 21/823487; H01L 21/8234; H01L 21/823412; H01L 21/823418; H01L 21/823437
See application file for complete search history.

(56) References Cited

U.S. PATENT DOCUMENTS

| 8,450,175 B2* | 5/2013 | Guha | ................ H01L 29/66666 438/259 |
| 8,609,488 B2* | 12/2013 | Guha | ................ H01L 27/10876 438/259 |

(Continued)

OTHER PUBLICATIONS

U.S. Appl. No. 16/132,879, filed Sep. 17, 2018, by Liu et al.

*Primary Examiner* — Alonzo Chambliss
(74) *Attorney, Agent, or Firm* — Wells St. John P.S.

(57) ABSTRACT

An array of vertical transistors comprises spaced pillars individually comprising a channel region of individual vertical transistors. A horizontally-elongated conductor line directly electrically couples together individual of the channel regions of the pillars of a plurality of the vertical transistors. An upper source/drain region is above the individual channel regions of the pillars, a lower source/drain region is below the individual channel regions of the pillars, and a conductive gate line is operatively aside the individual channel regions of the pillars and that interconnects multiple of the vertical transistors. Methods are disclosed.

29 Claims, 13 Drawing Sheets

(51) Int. Cl.
*H01L 21/8234* (2006.01)
*H01L 29/08* (2006.01)
*H01L 29/10* (2006.01)
*H01L 29/78* (2006.01)
*H01L 27/1159* (2017.01)
*H01L 27/11507* (2017.01)
*H01L 23/528* (2006.01)
*H01L 29/786* (2006.01)
*H01L 29/792* (2006.01)
*H01L 27/24* (2006.01)
*H01L 21/8239* (2006.01)
*H01L 27/108* (2006.01)
*H01L 21/768* (2006.01)
*H01L 21/311* (2006.01)

(52) U.S. Cl.
CPC ... *H01L 21/31111* (2013.01); *H01L 21/76802* (2013.01); *H01L 21/76877* (2013.01)

(56) References Cited

U.S. PATENT DOCUMENTS

| | | | |
|---|---|---|---|
| 8,790,977 B2 * | 7/2014 | Guha | H01L 29/66666 |
| | | | 438/259 |
| 10,217,865 B2 * | 2/2019 | Masuoka | H01L 27/11 |
| 10,622,361 B2 * | 4/2020 | Pandey | H01L 29/66666 |
| 2014/0008711 A1 * | 1/2014 | Park | H01L 29/7827 |
| | | | 257/296 |
| 2018/0374855 A1 * | 12/2018 | Pandey | H01L 27/10852 |

\* cited by examiner

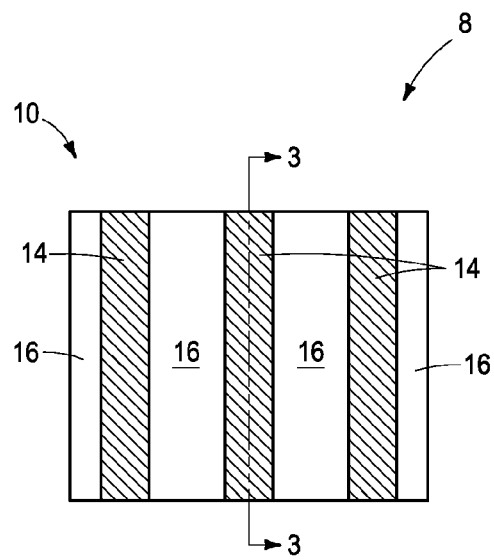
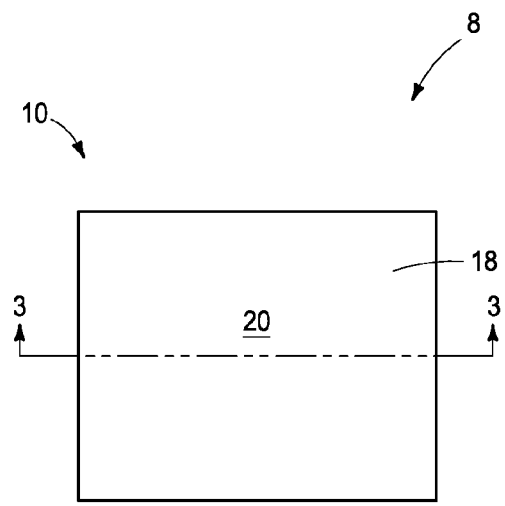
FIG. 1    FIG. 2
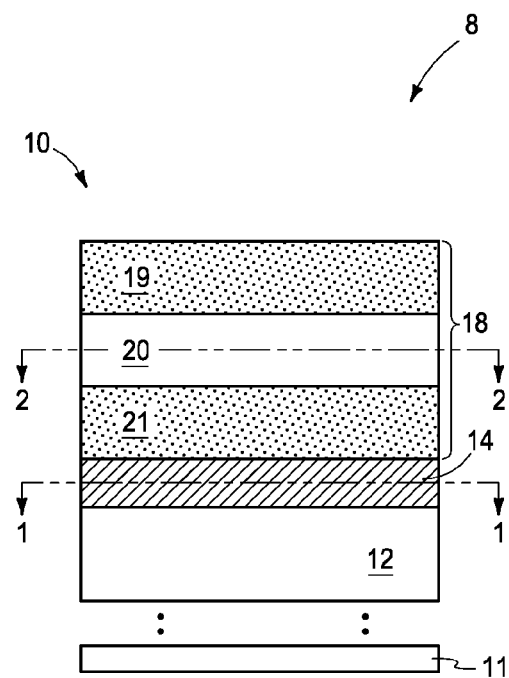
FIG. 3

METHOD OF FORMING AN ARRAY OF VERTICAL TRANSISTORS

TECHNICAL FIELD

Embodiments disclosed herein pertain to arrays of vertical transistors and to methods of forming an array of vertical transistors.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. The gate insulator may be capable of being programmed between at least two retentive capacitive states whereby the transistor is non-volatile. Alternately, the gate insulator may not be so capable whereby the transistor is volatile. Regardless, field effect transistors may also include additional structure, for example a reversibly programmable charge-storage region as part of the gate construction between the gate insulator and the conductive gate.

A capacitor is another type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry and fabricated into arrays that may or may not be at least part of a memory array.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-27 are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 4:
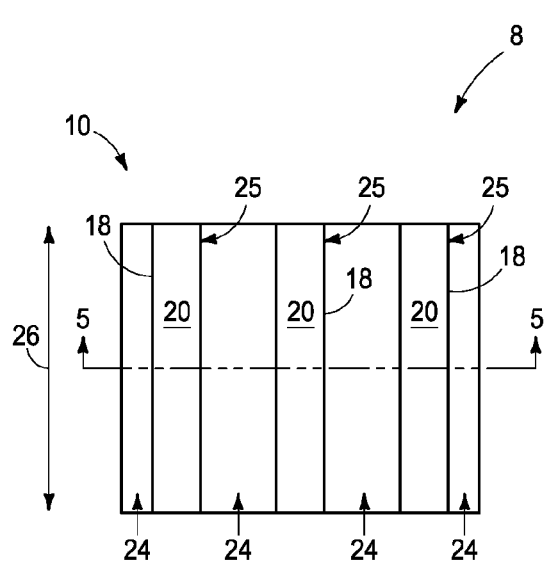

Embodiments of the invention include methods used in forming an array of transistors, for example as may be used in memory or other integrated circuitry. Embodiments of the invention also include an array of transistors independent of method of manufacture. Example embodiments of methods of forming an array of transistors are described with reference to FIGS. 1-27 and 29.

Referring to FIGS. 1-3, such show an example substrate construction 8 comprising an array or array area 10 that has been fabricated relative to a base substrate 11. Substrate 11 may comprise any of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Example material 12 (e.g., insulator material, undoped or lightly-doped semiconductive material, circuitry components, etc.) is above base substrate 11. In one embodiment, laterally-spaced metal-material lines 14 having insulator material 16 there-between are above material 12. In one such embodiment, metal-material lines 14 may comprise digit lines of memory circuitry. Example insulator material 16 includes a combination of silicon dioxide and silicon nitride, for example deposited as lining layers (not shown) between previously-formed metal-material lines 14, and which may be planarized back to provide an uppermost planar surface thereof.

Transistor material 18 is above material 12 and in one embodiment is directly against and thereby directly electrically coupled to metal-material lines 14. Transistor material 18 as a minimum may be considered as comprising a channel region of what will be individual vertical transistors at the conclusion of fabrication. In the depicted example and in one embodiment, transistor material 18 may be considered as comprising an upper source/drain region 19, a lower source/drain region 21, and a channel region 20 vertically there-between of what will be the individual vertical transistors being fabricated. Regions 19, 20, and 21 may or may not be intrinsically at desired conductivity/semiconductivity at this point in processing. Regardless, and by way of examples only, transistor material 18 may alternately comprise solely a channel region (not shown), a combination of a channel region and a lower source/drain region only (not shown), or a combination of an upper source/drain region and a channel region only (not shown). Example transistor material 18 includes any existing or future-developed and ultimately appropriately-doped semiconductive material(s), and which may include LDD, halo, etc. regions (not shown).

Figure 5:
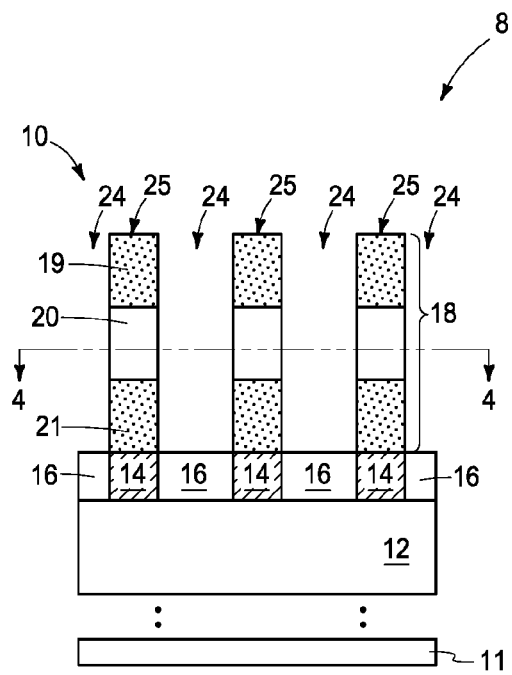

Referring to FIGS. 4 and 5, transistor material 18 has been formed into laterally-spaced and horizontally-elongated lines 25 having trenches 24 there-between. All trenches herein for simplicity are shown with vertical sidewalls although such may taper laterally inward and/or outward. Lines 25 may be formed by any existing or future-developed technique including, for example photolithographic patterning and etch with or without pitch multiplication. Transistor-material lines 25 in one embodiment may be considered as extending in a column direction 26. In one embodiment and as shown, transistor-material lines 25 have been formed directly above, directly against, and horizontally-along individual metal-material lines 14. Lines 25 (and lines 14) are shown as being straight-linear, although curvilinear, combination of different straight segments angled relative one another, combination of straight and curved segments, etc. may be used.

Figure 6:
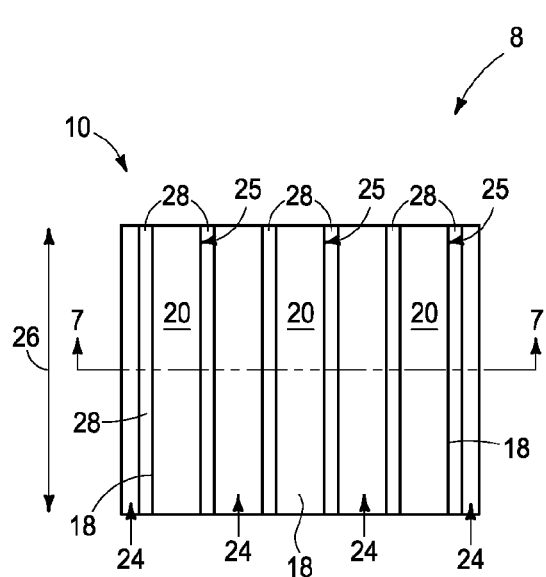
Figure 7:
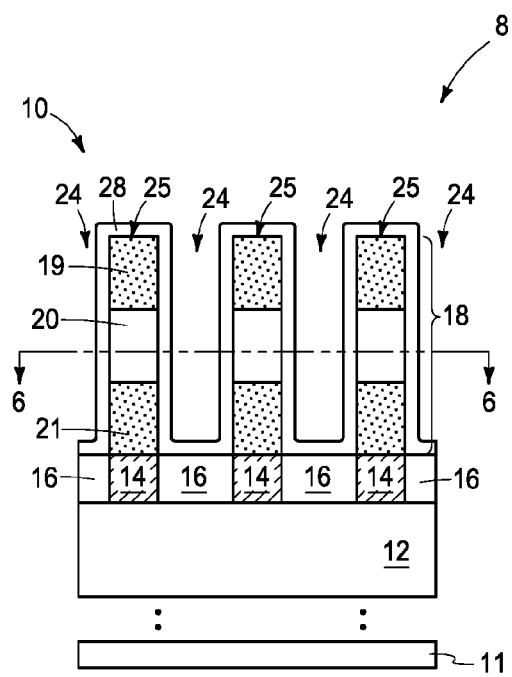

Referring to FIGS. 6 and 7, lateral sides of trenches 24 between transistor-material lines 25 have been lined with insulative material 28 (e.g., silicon dioxide or other low-k [no greater than 3.9] material). Hard-masking material (e.g., silicon nitride and not shown) may remain over transistor-material lines 25 and over which insulative material 28 is deposited (not shown).

Figure 8:
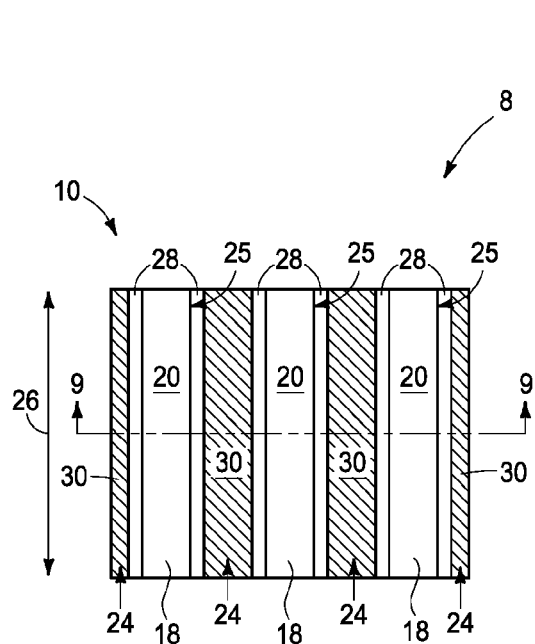
Figure 9:
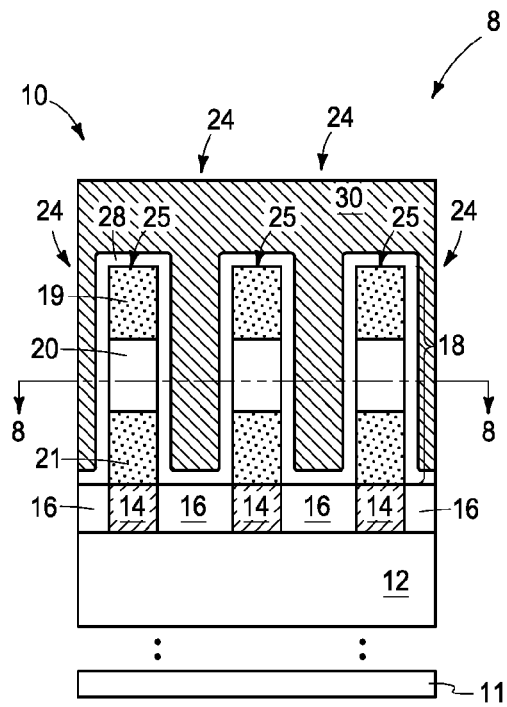

Referring to FIGS. 8 and 9, conductor material 30 has been deposited and overfills trenches 24. An example conductor material 30 is conductively-doped semiconductive material, for example heavily-conductively-doped polysilicon. A thin metal-material lining (not shown) may first be deposited as part of conductor material 30. Alternatively, and by way of example only, conductor material 30 may at least predominately comprise metal material.

Figure 10:
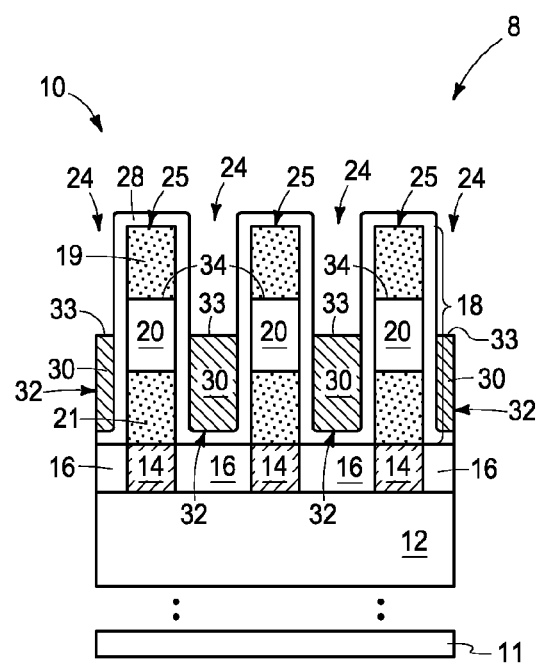
Figure 11:
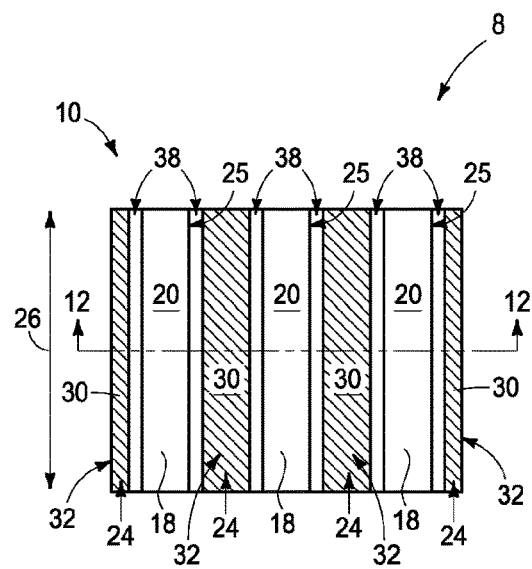
Figure 12:
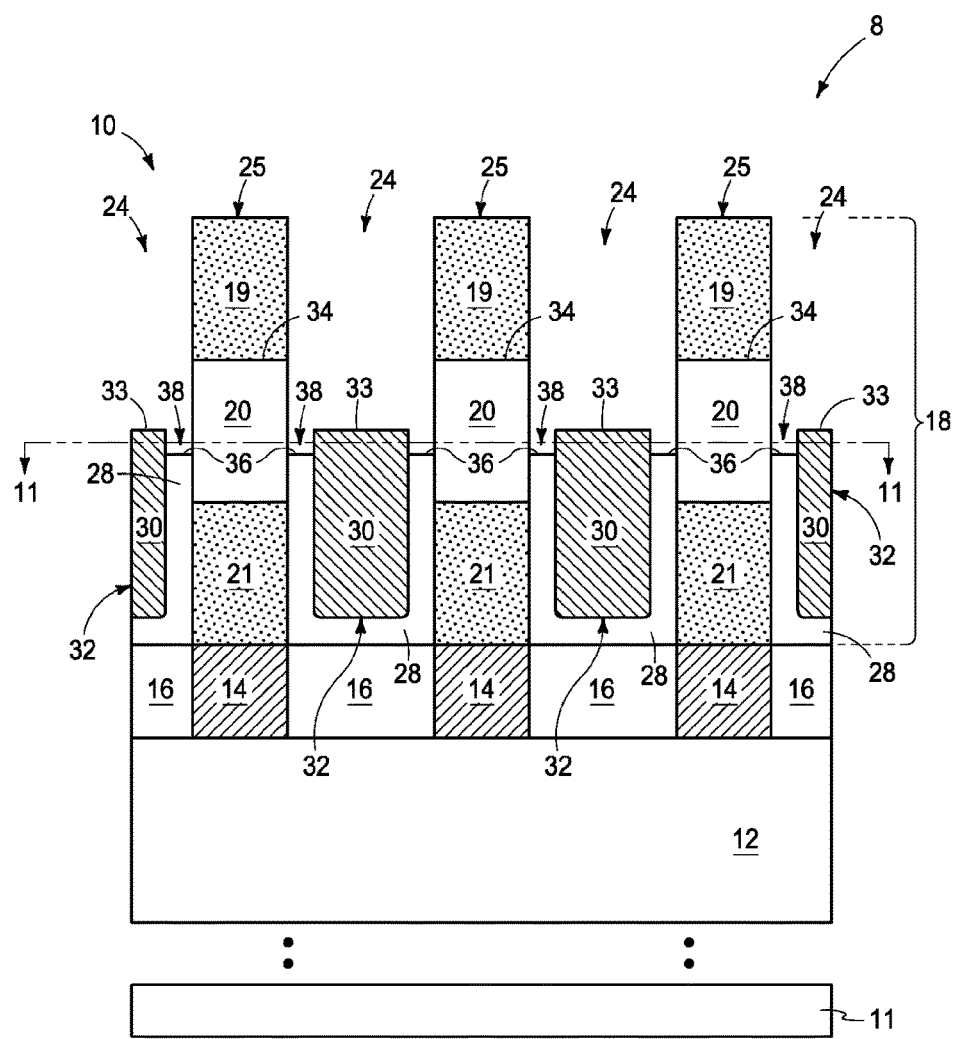

Referring to FIG. 10, conductor material 30 has been vertically recessed back thereby forming a horizontally-elongated conductor line 32 in individual insulative-material-lined trenches 24 between immediately-laterally-adjacent transistor-material lines 25. In one embodiment, conductor lines 32 are formed in column direction 26.

The above-described processing is but one example method of forming laterally-spaced and horizontally-elongated transistor-material lines 25 having a horizontally-elongated conductor line 32 between immediately-laterally-adjacent transistor-material lines 25, and in one embodiment where conductor lines 32 are formed after forming transistor-material lines 25. Alternate existing or future-developed techniques may be used. Regardless, and in one embodiment, transistor-material lines 25 are formed to be taller than conductor lines 32. In one embodiment, conductor lines 32 are shown to have respective tops 33 that are lower than a top 34 of channel region 20 of transistor-material lines 25 that are on both lateral sides of individual conductor lines 32. Alternately, as an example, the conductor line may be formed to have a top that is elevationally-coincident (FIG. 29) with a top of the channel region of the transistor-material lines that are on both lateral sides of the conductor line Referring to FIGS. 11 and 12, insulative material 28 has been vertically recessed (e.g., by wet etching selectively relative to materials 18 and 30) to have tops 36 that are lower than respective tops 33 of conductor line 32 there-between. Such forms a vertical recess 38 that is laterally-between conductor line 32 and channel region 20 of immediately-laterally-adjacent transistor-material lines 25 on each lateral side of conductor line 32.

Figure 13:
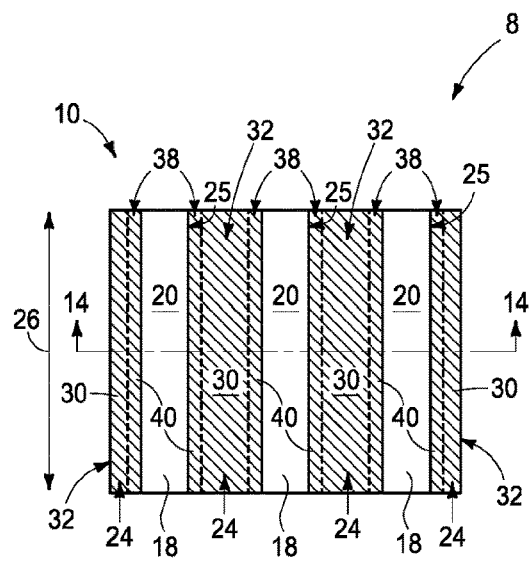
Figure 14:
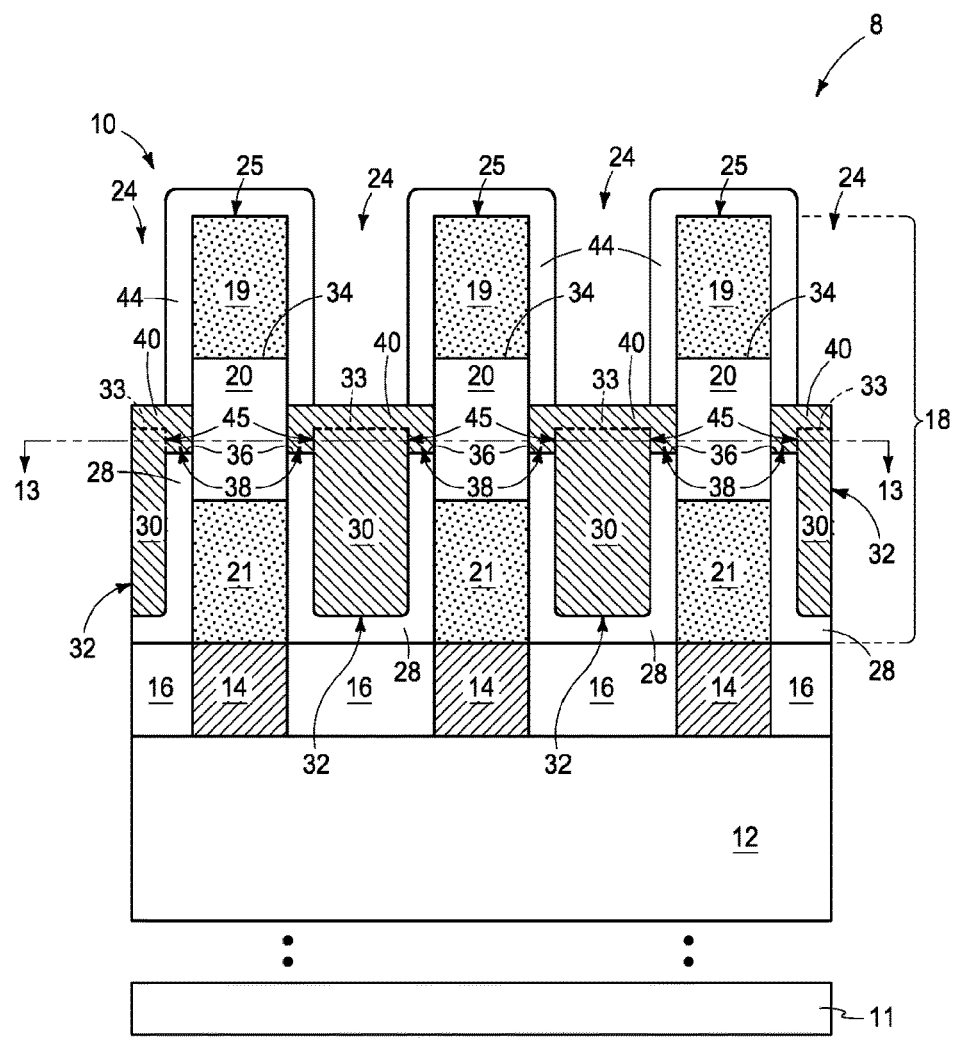

Referring to FIGS. 13 and 14, conducting material 40 has been formed in vertical recesses 38 on each lateral side of conductor line 32 and that directly electrically couples conductor line 32 to channel region 20 of immediately-laterally-adjacent transistor-material lines 25 on each lateral side of individual conductor lines 32. Any suitable conducting material may be used. Such may be of the same or of different composition from that of material 30, with example same composition being shown. In one embodiment, a material 44 is deposited that comprises undoped semiconductive material (e.g., undoped polysilicon) that is conductively doped by out-diffusion of conductivity-increasing dopant that is in conductor line 32 thereby forming conducting material 40. Such may occur during deposition of material 44 or subsequently. Sufficient dopant-out-diffusion may make some of material 40 above vertical recesses 38 conductive, as shown, but such should not extend sufficiently high to short to upper source/drain region 19. As an alternate example, metal material may be deposited into vertical recesses 38.

Figure 15:
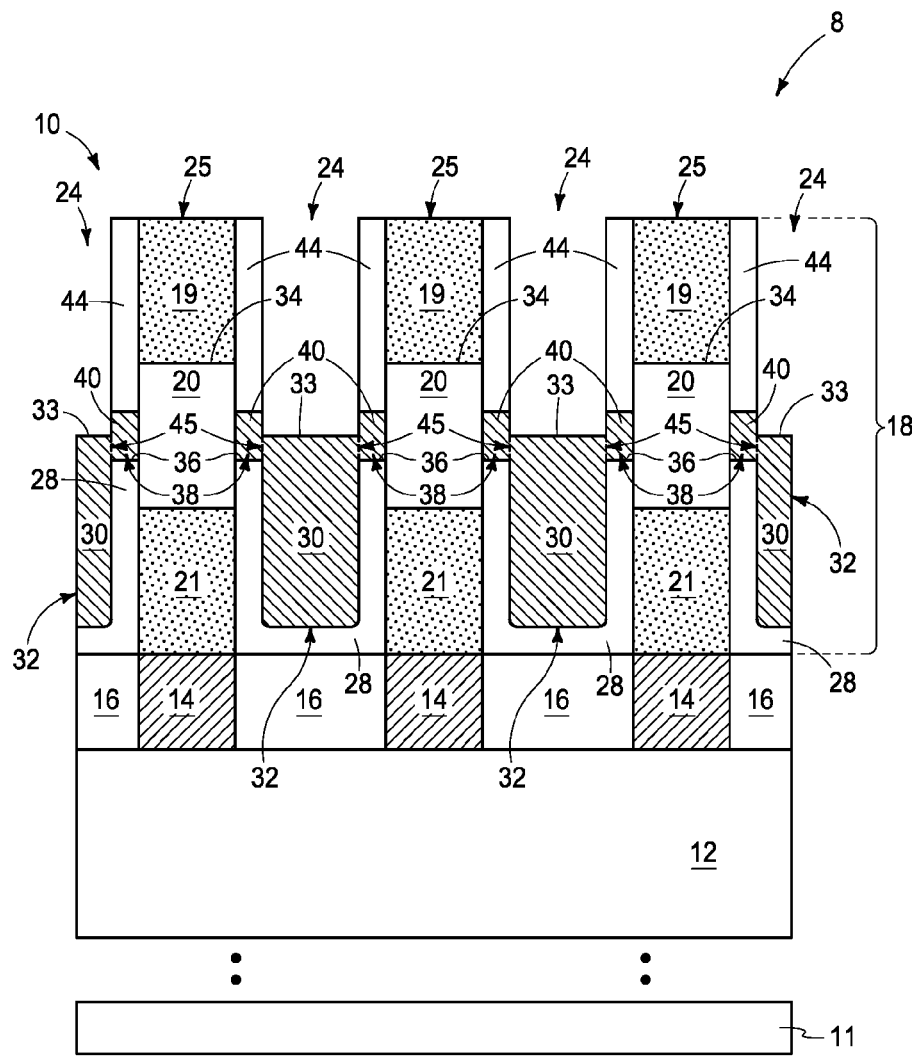
Figure 16:
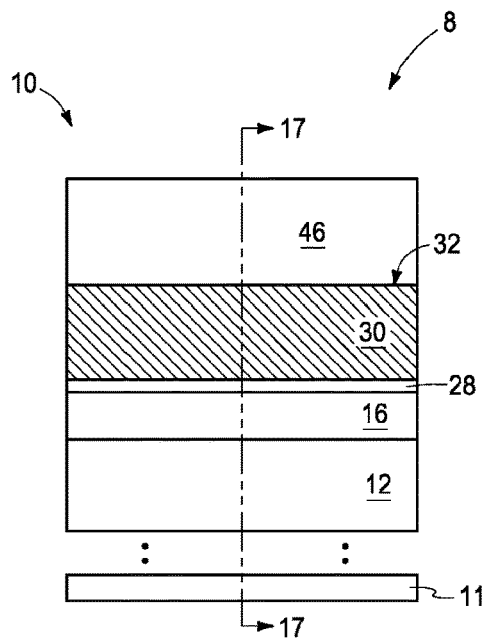
Figure 17:
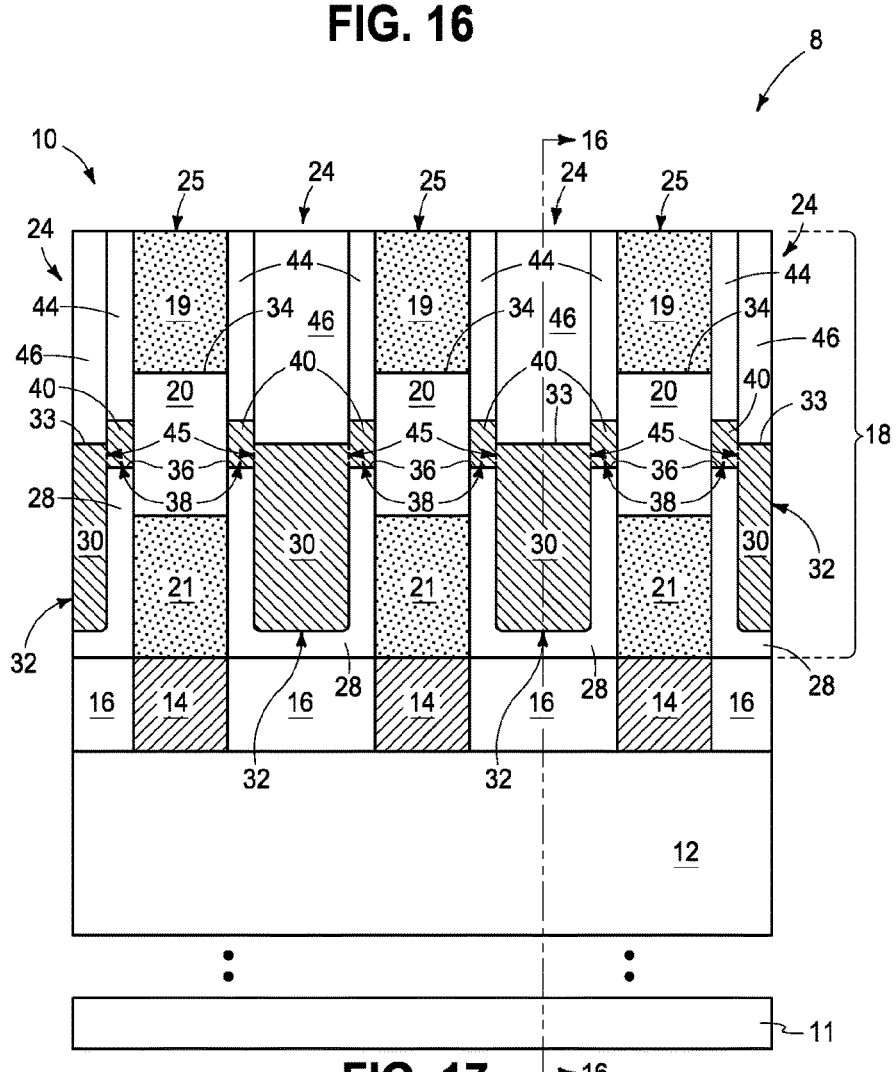
Figure 18:
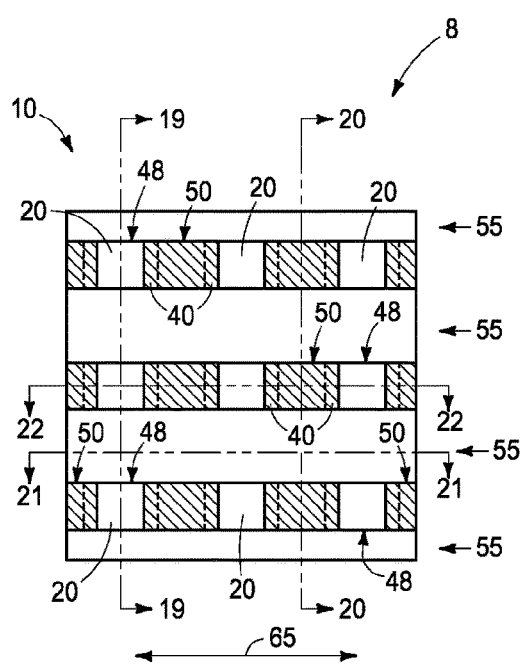
Figure 19:
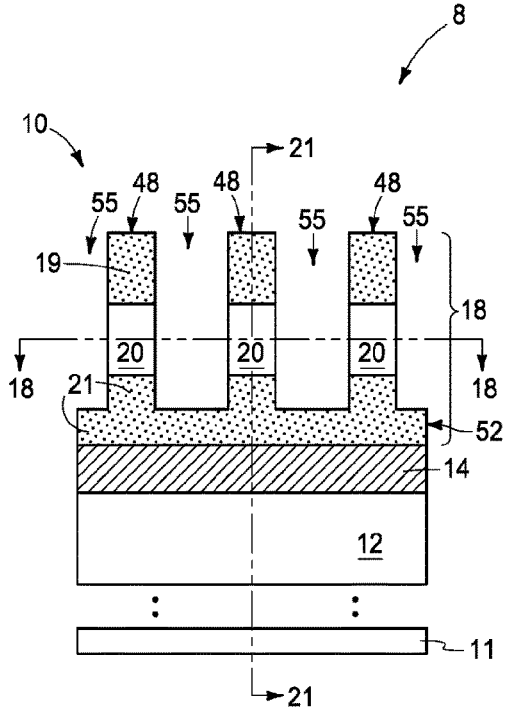
Figure 20:
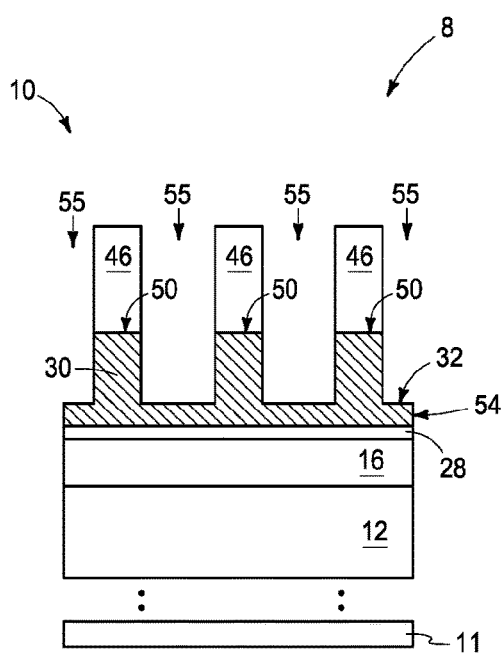
Figure 21:
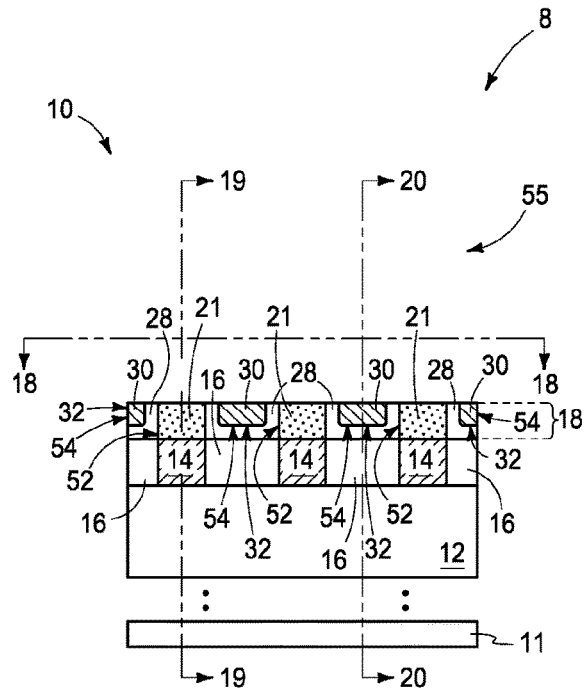

Referring to FIG. 15, conducting material 40 has have been optionally removed from tops 33 of conductor lines 32 (e.g., by a short isotropic or by an anisotropic etch). FIGS. 16 and 17 show subsequent formation of insulator material 46 (e.g., silicon dioxide) between example material 44 that coats sides of transistor-material lines 25.

The above processing is but one example method of forming conductor line 32 to be electrically coupled to channel region 20 of transistor-material lines 25 on both lateral sides of conductor line 32. Any alternate existing or future-developed technique may be used. The above also is but one example embodiment where conductor line 32 is initially formed to not be directly electrically coupled to channel regions 20, with conductor line 32 subsequently being directly electrically coupled to channel regions 20 by forming conducting material 40 directly against and spanning between conductor line 32 and channel regions 20 on both lateral sides thereof.

Referring to FIGS. 18-22, transistor-material lines 25 (not numerically designated) have been cut (e.g., by photolithographic patterning and etch with or without pitch multiplication) to form spaced pillars 48 individually comprising channel region 20. In some embodiments, pillars 48 are referred to as first pillars 48 to distinguish from second pillars identified below. Regardless, conductor line 32 directly electrically couples together individual channel regions 20 of pillars 48 of a plurality of the vertical transistors being formed (e.g., in column direction 26). In one embodiment and as shown, the cutting is not completely through transistor material 18 of transistor-material lines 25, thus leaving a continuous line 52 of transistor material 18 (lower source/drain region 21) running horizontally below and from which pillars 48 upwardly project.

In one embodiment and as shown, conductor line 32 has also been cut to form spaced conductive pillars 50 (in some embodiments referred to as second pillars 50) projecting upwardly from a continuous line 54 of conductor material 30 of conductor line 32. In one such embodiment and as shown, the acts of cutting of transistor-material lines 25 and cutting of conductor lines 32 uses a single/common masking step for both. For example, and by way of example, patterned masking material (not shown) may be provided atop transistor-material lines 25 and insulator material 46 in a row direction 65, with the acts of cutting as described above with respect to transistor-material lines 25 and conductor lines 32 occurring at essentially the same time or at least in the same single common masking step and forming the illustrated trenches 55.

An upper source/drain region above the individual channel regions of the pillars and a lower source/drain region below the individual channel regions of the pillars are ultimately formed. In the depicted example embodiments, upper source/drain region 19 and lower source/drain region 21 have been formed in individual pillars 48. Lower source/drain region 19 is shown both as part of individual pillars 48 and continuous line 52. Alternately, by way of examples, the lower source/drain regions may be formed entirely below pillars 48 (not shown) and/or the upper source/drain regions may be formed at least partially above pillars 48 (not shown).

FIGS. 23-27 show subsequent processing whereby a conductive gate line 60 (two being shown) has been formed operatively aside individual channel regions 20 of pillars 48, thus forming vertical transistors 75 (only a few outlines 75 being shown for drawing clarity). Gate line 60 interconnects multiple vertical transistors 75 (e.g., in row direction 65). A gate insulator 61 is between conductive gate lines 60 and channel regions 20. In one embodiment and as shown, conductor lines 32 and conductive gate lines 60 are angled (i.e., other than the straight angle) relative one another, with in one such embodiment conductive gate lines 60 being formed in row direction 65. Any suitable existing or future-developed methods may be used to form the example construction of FIGS. 23-27. As an example, after forming gate insulator 61, insulator or sacrificial material would be formed in trenches 55 to have top surfaces where the bottom surfaces of the conductive gate lines 60 are to be. A layer of the conductive material of the conductive gate lines would then be deposited to line trenches 55, with such then being anisotropically etched back in a spacer-forming-like manner to substantially remove such from horizontal surfaces and form the depicted conductive gate lines 60. If sacrificial material was used, it could now be removed. Regardless, insulator material 76 (e.g., silicon dioxide and/or silicon nitride) would be deposited to fill remaining volume of trenches 55.

Any other attribute(s) or aspect(s) as shown and/or described herein with respect to other embodiments may be used with respect to the above-described embodiments.

Figure 22:
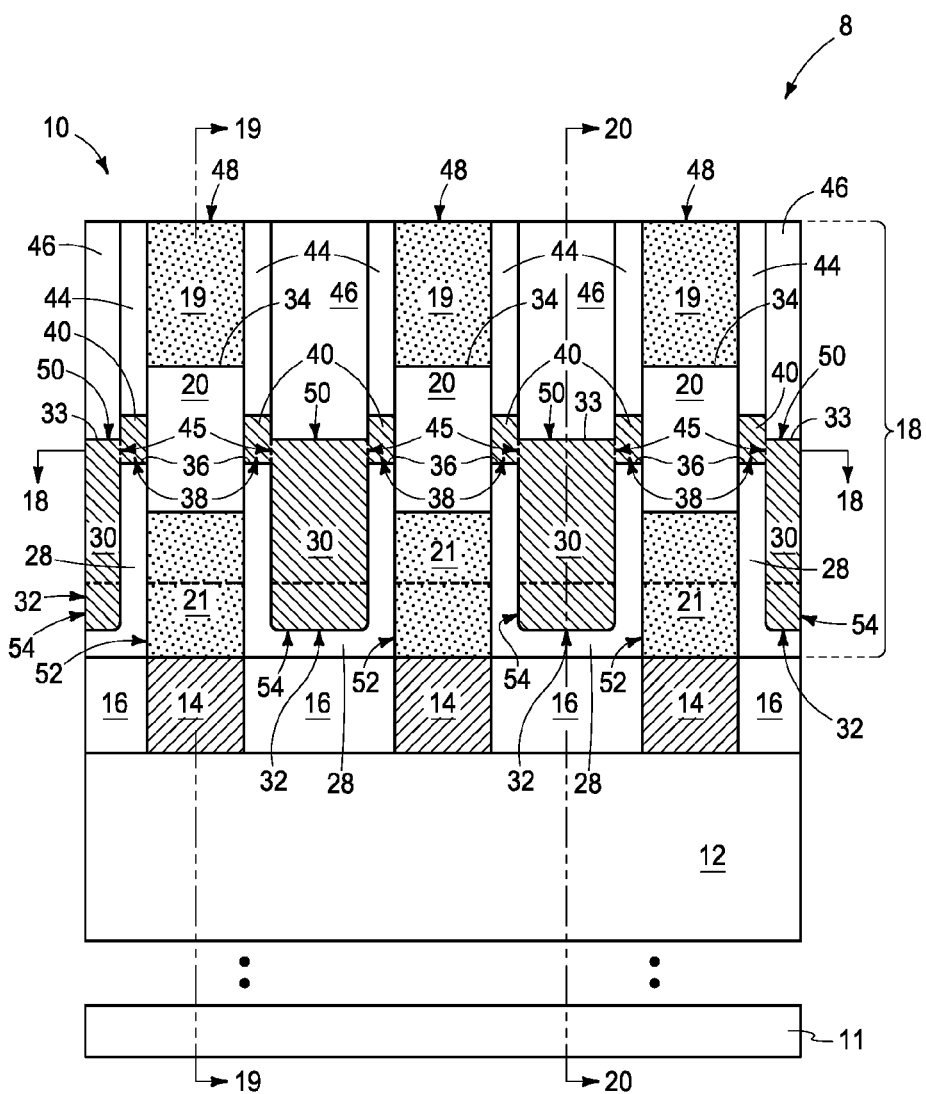
Figure 23:
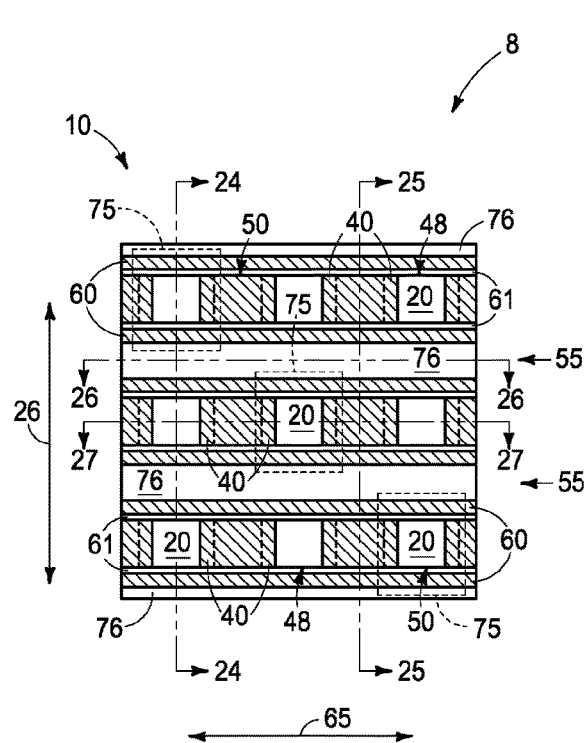
Figure 24:
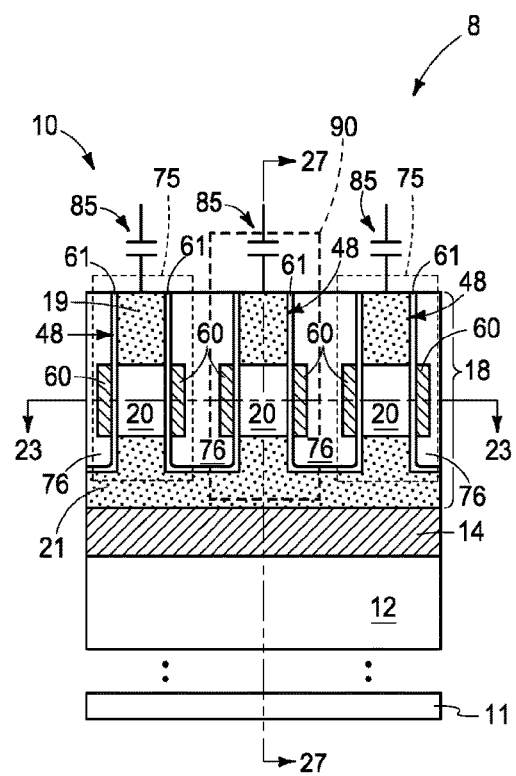
Figure 25:
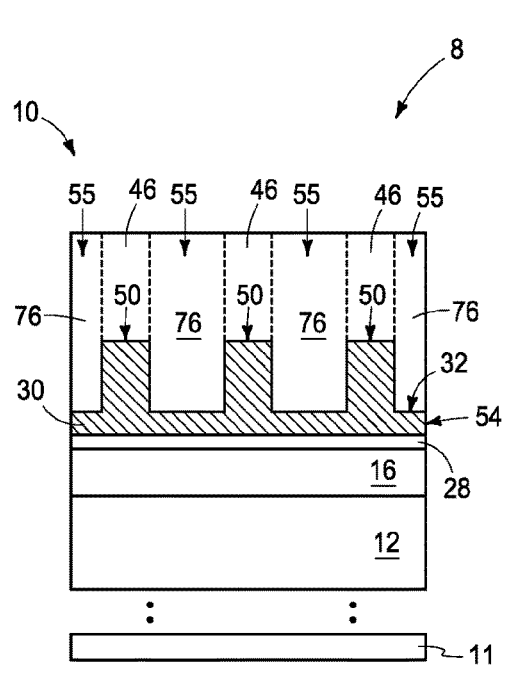
Figure 26:
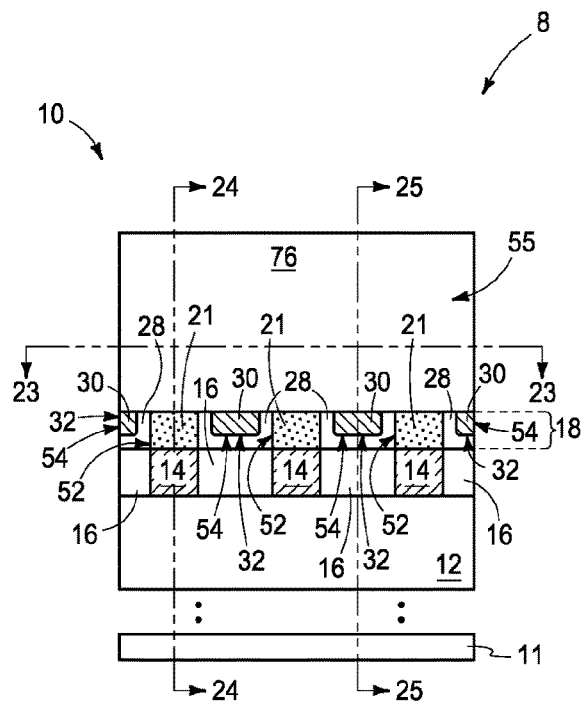
Figure 27:
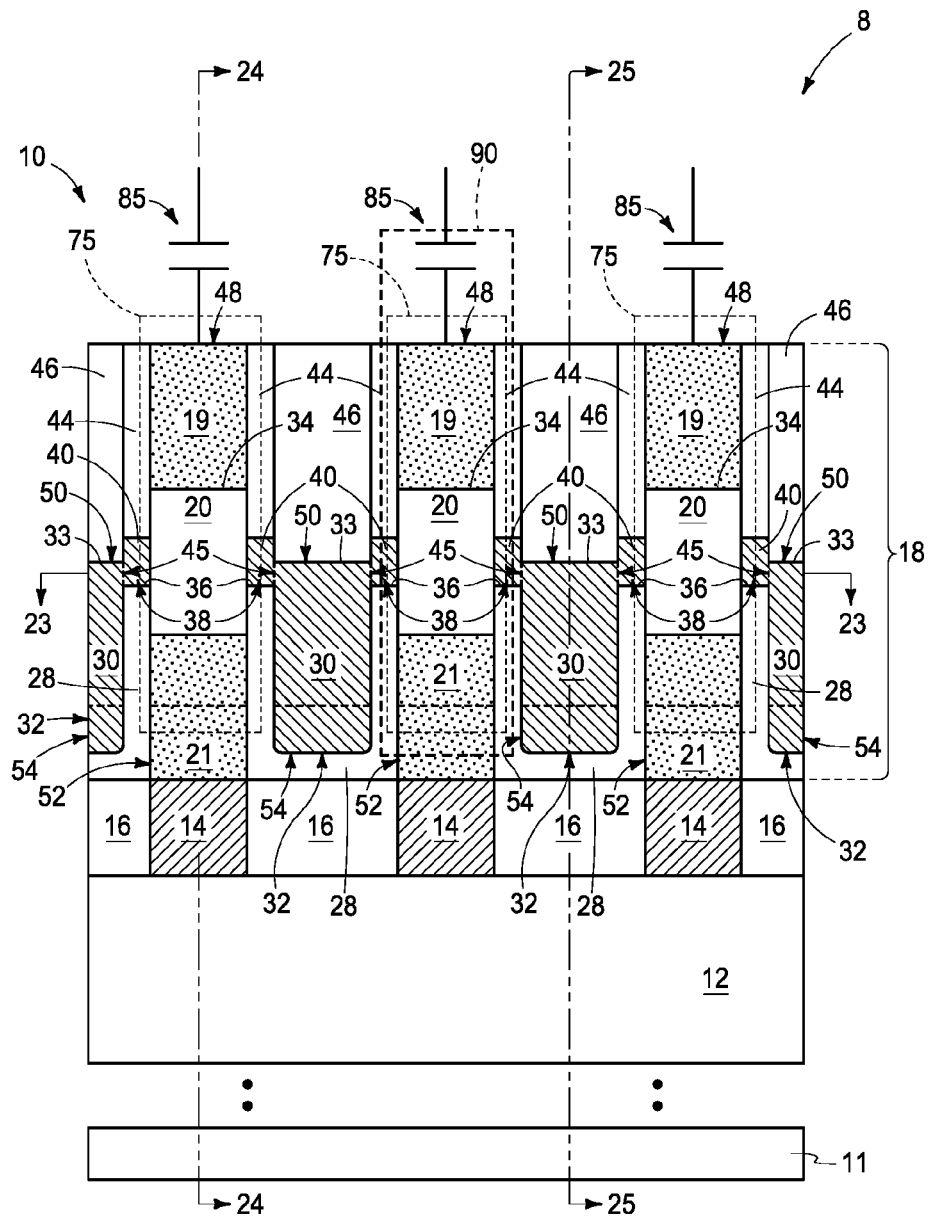
Figure 28:
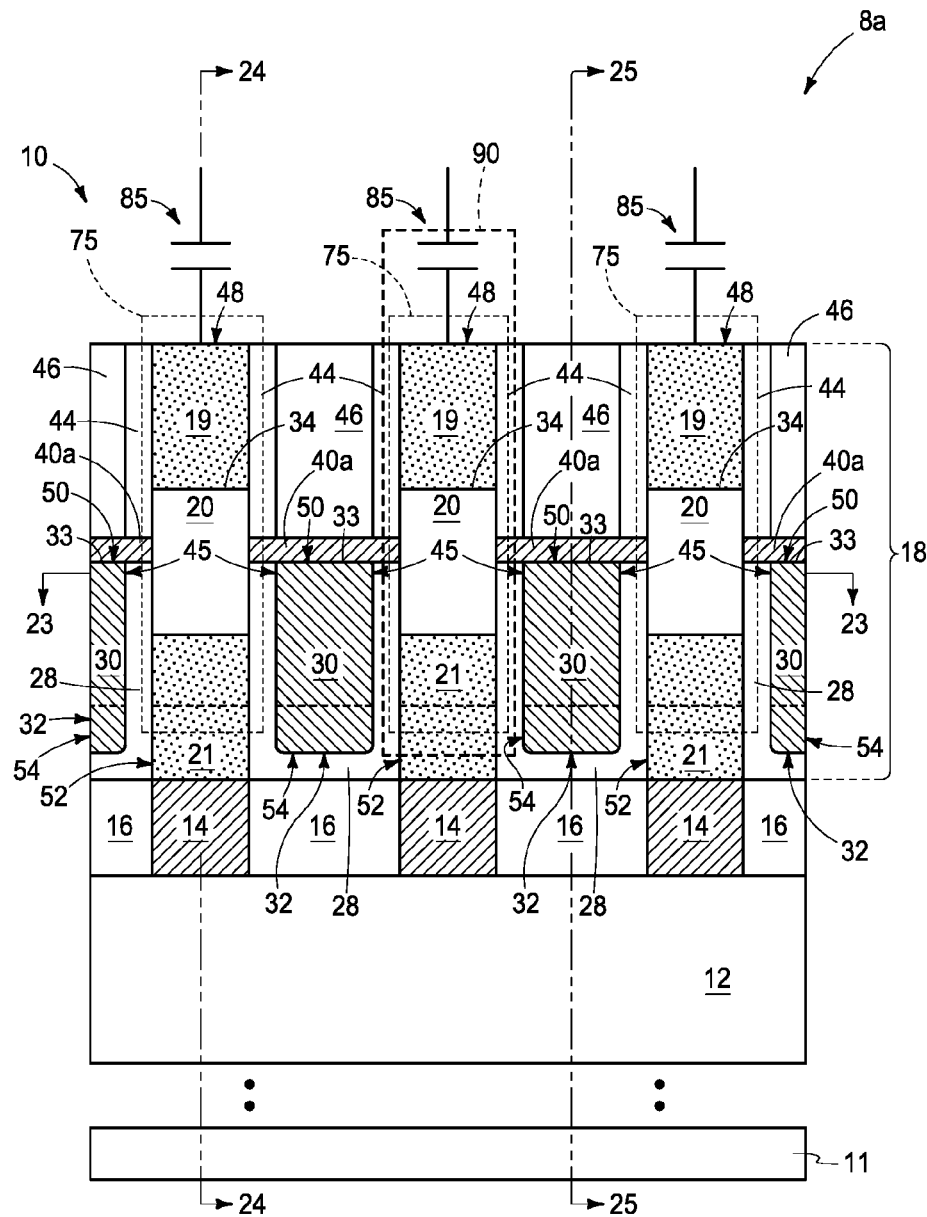
FIGS. 28 and 29 are diagrammatic cross-sectional views of substrates or substrates in process in accordance with embodiments of the invention.
Figure 29:
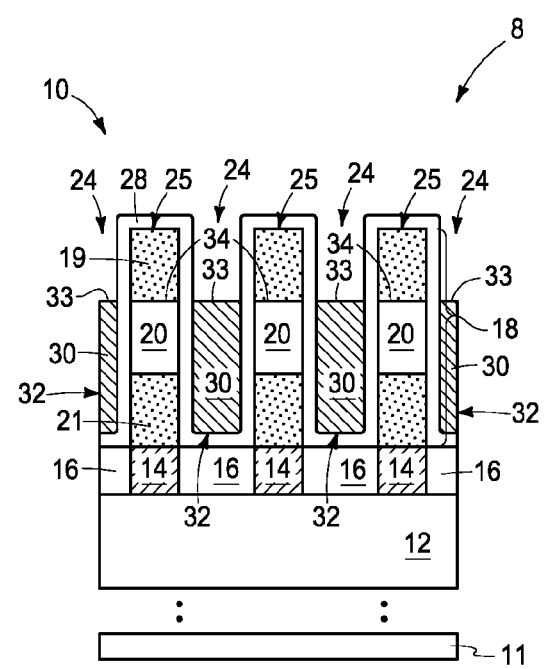

The above-described and shown embodiments form conducting material 40 directly against a lateral side 45 (FIGS. 14, 15, 17, 22, 27) of conductor line 32. FIGS. 22 and 27 also show an example embodiment where conducting material 40 where directly against conductor line 32 is formed to be directly against only lateral sides of conductor line 32 in a finished construction (example conductive pillars 50 inherently being part of conductor lines 32). Alternately, and by way of example only, the conducting material may be formed to be directly against the top of the conductor line in the finished construction, and in one such embodiment to be directly against only the top of the conductor line in the finished construction. For example, and by way of example only, if the example etch of FIG. 14 to produce the construction of FIG. 15 were not conducted, materials 30 and 40 of the FIG. 14 construction would be in the finished construction whereby conducting material 40 is directly against conductor line tops 33. An alternate example is described with reference to FIG. 28 showing a construction 8a. Like numerals from the above-described embodiments have been used where appropriate, with some construction differences being indicated with the suffix "a" or with different numerals. Example conducting material 40a is shown, where directly against conductor lines 32, as being directly against only tops 33 of conductor lines 32 in the finished construction (example conductive pillars 50 inherently being part of conductor lines 32). Any other attribute(s) or aspect(s) as shown and/or described herein with respect to other embodiments may be used.

The above are but example methods of forming an array of transistors. Such may or may not comprise part of memory circuitry, with individual transistors that may or may not comprise part of a memory cell of an array of memory cells. Accordingly, and regardless, processing and formation of integrated circuitry structure may occur before or after processing as shown and described above in further fabrication of integrated circuitry incorporating example transistors 75.

Array 10 of vertical transistor 75 may inherently comprise memory cells where, for example, gate insulator 61 comprises programmable material, for example ferroelectric material, and/or where the vertical transistors comprise a programmable charge storage structure as part of their respective gate constructions (not shown). Alternately, and by way of example only, storage devices, for example charge-storage devices such as capacitors 85 (shown schematically) may individually couple to individual upper source/drain regions 19 whereby memory cells 90 are formed that individually comprise a capacitor 85 and a transistor 75 (only one outline 90 being shown in each of FIGS. 24, 27, and 28 for clarity). Alternately, and by way of example only, cross point memory cells (not shown) could be formed above upper source/drain regions 19, with transistors 75 functioning as select devices. Further alternately and by way of examples only, storage devices could be formed below the depicted structure (not shown) and be directly electrically coupled to lower source/drain regions 21 and upper source/drain regions 19 coupled to digitlines (not shown).

Embodiments of the invention include an array of transistors independent of method of manufacture. Nevertheless, such an array may have any of the attributes as described herein in method embodiments. Likewise, the above-described method embodiments may incorporate and form any of the attributes described with respect to device embodiments.

Embodiments of the invention include an array (e.g., 10) of vertical transistors (e.g., 75) comprising spaced pillars (e.g., 48) individually comprising a channel region (e.g., 20) of individual vertically transistors. A horizontally-elongated conductor line (e.g., 32/54/50) directly electrically couples together individual channel regions of the pillars of a plurality of the vertical transistors. An upper source/drain region (e.g., 19) is above the individual channel regions of the pillars and a lower source/drain region (e.g., 21) is below the individual channel regions of the pillars. A conductive gate line (e.g., 60) is operatively aside the individual channel regions of the pillars and interconnects multiple of the vertical transistors. Any other attribute(s) or aspect(s) as shown and/or described herein with respect to other embodiments may be used.

Embodiments of the invention include an array (e.g., 10) of vertical transistors (e.g., 75) comprising spaced first pillars (e.g., 48) individually comprising a channel region (e.g., 20) of individual vertical transistors and an upper source/drain region (e.g., 19) directly above the channel region. A conductor line (e.g., 32/54/50) is horizontally-elongated in a column direction (e.g., 26) and directly electrically couples together individual of the channel regions of the first pillars of a plurality of the vertical transistors. The conductor line comprises spaced conductive second pillars (e.g., 50) projecting upwardly from a continuous line (e.g., 54) of conductor material (e.g., 30) of the conductor line. A lower source/drain region (e.g., 21) is below the individual channel regions of the first pillars. A conductive gate line (e.g., 60) is operatively aside the individual channel regions of the first pillars and interconnects multiple of the vertical transistors in a row direction (e.g., 65). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming an array of vertical transistors comprises forming laterally-spaced and horizontally-elongated lines comprising transistor material and a horizontally-elongated conductor line between immediately-laterally-adjacent of the transistor-material lines. The transistor material comprises a channel region of what will be individual vertical transistors. The conductor line is directly electrically coupled to the channel regions of the transistor-material lines on both lateral sides of the conductor line. The transistor-material lines are cut to form spaced pillars individually comprising the channel region of the individual vertical transistors. The conductor line directly electrically couples together individual of the channel regions of the pillars of a plurality of the vertical transistors. An upper source/drain region is formed above the individual channel regions of the pillars, a lower source/drain region is formed below the individual channel regions of the pillars, and a conductive gate line is formed operatively aside the individual channel regions of the pillars and interconnects multiple of the vertical transistors.

In some embodiments, a method of forming an array of vertical transistors comprises forming laterally-spaced and horizontally-elongated transistor-material lines in a column direction. The transistor material comprises an upper source/drain region, a lower source/drain region, and a channel region vertically there-between of what will be individual vertical transistors. After the transistor-material lines are formed a horizontally-elongated conductor line is formed in the column direction between immediately-laterally-adjacent of the transistor-material lines. After the conductor line is formed, conducting material is formed that directly electrically couples the conductor line to the channel regions of the transistor-material lines that are on both lateral sides of the conductor line. In a single masking step, cutting is conducted of: (a) the transistor-material lines to form spaced first pillars individually comprising the channel region of the individual vertical transistors, with the conductor line directly electrically coupling together individual of the channel regions of the first pillars of a plurality of the vertical transistors in the column direction; and (b) the conductor line to form spaced conductive second pillars projecting upwardly from a continuous line of conductor material of the conductor line. A conductive gate line is formed operatively aside the individual channel regions of the first pillars and interconnects multiple of the vertical transistors in a row direction.

In some embodiments, a method of forming an array of vertical transistors comprises forming laterally-spaced and horizontally-elongated lines comprising transistor material. The transistor material comprises a channel region of what will be individual vertical transistors. Lateral sides of trenches that are between the transistor-material lines are lined with insulative material. A horizontally-elongated conductor line is formed in individual of the insulative-material-lined trenches between immediately-laterally-adjacent of the transistor-material lines. The insulative material is vertically recessed to have tops that are lower than a top of the conductor line there-between thereby forming a vertical recess that is laterally-between the conductor line and the channel region of the immediately-laterally-adjacent transistor-material lines on each lateral side of the conductor line. Conducting material is formed in the vertical recess on each said lateral side of the conductor line and that directly electrically couples the conductor line to the channel region of the immediately-laterally-adjacent transistor-material lines on each lateral side of the conductor line. The transistor-material lines are cut to form spaced pillars individually comprising the channel region of the individual vertical transistors. The conductor line directly electrically couples together individual of the channel regions of the pillars of a plurality of the vertical transistors. An upper source/drain region is formed above the individual channel regions of the pillars, a lower source/drain region is formed below the individual channel regions of the pillars, and a conductive gate line is formed operatively aside the individual channel regions of the pillars and interconnects multiple of the vertical transistors.

In some embodiments, an array of vertical transistors comprises spaced pillars individually comprising a channel region of individual vertical transistors. A horizontally-elongated conductor line directly electrically couples together individual of the channel regions of the pillars of a plurality of the vertical transistors. An upper source/drain region is above the individual channel regions of the pillars, a lower source/drain region is below the individual channel regions of the pillars, and a conductive gate line is operatively aside the individual channel regions of the pillars and that interconnects multiple of the vertical transistors.

In some embodiments, an array of vertical transistors comprises spaced first pillars individually comprising a channel region of individual vertical transistors and an upper source/drain region directly above the channel region. A conductor line horizontally-elongated in a column direction directly electrically couples together individual of the channel regions of the first pillars of a plurality of the vertical transistors. The conductor line comprises spaced conductive second pillars projecting upwardly from a continuous line of conductor material of the conductor line. A lower source/drain region is below the individual channel regions of the first pillars. A conductive gate line is operatively aside the individual channel regions of the first pillars and that interconnects multiple of the vertical transistors in a row direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of vertical transistors, comprising:

forming laterally-spaced and horizontally-elongated lines comprising transistor material and a horizontally-elongated conductor line between immediately-laterally-adjacent of the transistor-material lines, the transistor material comprising a channel region of what will be individual vertical transistors, the conductor line being directly electrically coupled to the channel regions of the transistor-material lines on both lateral sides of the conductor line;

cutting the transistor-material lines to form spaced pillars individually comprising the channel region of the individual vertical transistors, the conductor line directly electrically coupling together individual of the channel regions of the pillars of a plurality of the vertical transistors; and forming an upper source/drain region above the individual channel regions of the pillars, a lower source/drain region below the individual channel regions of the pillars, and a conductive gate line operatively aside the individual channel regions of the pillars and that interconnects multiple of the vertical transistors.

2. The method of claim 1 comprising forming the conductor line after forming the transistor-material lines.

3. The method of claim 1 comprising forming the transistor-material lines to be taller than the conductor line.

4. The method of claim 1 forming the conductor line to have a top that is lower than a top of the channel region of the transistor-material lines that are on both lateral sides of the conductor line.

5. The method of claim 1 forming the conductor line to have a top that is elevationally-coincident with a top of the channel region of the transistor-material lines that are on both lateral sides of the conductor line.

6. The method of claim 1 wherein, the conductor line is initially formed to not be directly electrically coupled to the channel region of the transistor-material lines on both lateral sides of the conductor line; and the conductor line is directly electrically coupled to the channel region of the transistor-material lines on both lateral sides of the conductor line by forming conducting material directly against and spanning between the conductor line and the channel region of the of the transistor-material lines on both lateral sides of the conductor line after forming the transistor-material lines and the conductor line.

7. The method of claim 6 comprising forming the conducting material to be directly against a lateral side of the conductor line in a finished construction.

8. The method of claim 7 comprising forming the conducting material where directly against the conductor line to be directly against only the lateral side of the conductor line in the finished construction.

9. The method of claim 6 comprising forming the conducting material to be directly against a top of the conductor line in a finished construction.

10. The method of claim 9 comprising forming the conducting material where directly against the conductor line to be directly against only the top of the conductor line in the finished construction.

11. The method of claim 1 wherein the cutting is not completely through the transistor material of the transistor-material lines thus leaving a continuous line of the transistor material running horizontally below and from which the pillars upwardly project.

12. The method of claim 1 comprising cutting the conductor line to form spaced conductive pillars projecting upwardly from a continuous line of conductor material of the conductor line.

13. The method of claim 12 wherein the cutting of the transistor-material lines and the cutting of the conductor line uses a single common masking step for both.

14. The method of claim 1 comprising forming the transistor-material lines directly above, directly against, and horizontally-along individual metal-material lines.

15. The method of claim 1 comprising forming the conductor line and the conductive gate line to be angled relative one another.

16. The method of claim 1 comprising forming the upper source/drain region in individual of the pillars.

17. The method of claim 1 comprising forming the lower source/drain region in individual of the pillars.

18. The method of claim 1 comprising forming the upper and lower source/drain regions in individual of the pillars.

19. The method of claim 1 comprising forming the vertical transistors to comprise individual memory cells of a memory array.

20. A method of forming an array of vertical transistors, comprising:
- forming laterally-spaced and horizontally-elongated transistor-material lines in a column direction; the transistor material comprising an upper source/drain region, a lower source/drain region, and a channel region vertically there-between of what will be individual vertical transistors;
- after forming the transistor-material lines, forming a horizontally-elongated conductor line in the column direction between immediately-laterally-adjacent of the transistor-material lines;
- after forming the conductor line, forming conducting material that directly electrically couples the conductor line to the channel regions of the transistor-material lines that are on both lateral sides of the conductor line;
- in a single masking step, cutting:
  (a) the transistor-material lines to form spaced first pillars individually comprising the channel region of the individual vertical transistors, the conductor line directly electrically coupling together individual of the channel regions of the first pillars of a plurality of the vertical transistors in the column direction; and
  (b) the conductor line to form spaced conductive second pillars projecting upwardly from a continuous line of conductor material of the conductor line; and
- forming a conductive gate line operatively aside the individual channel regions of the first pillars and that interconnects multiple of the vertical transistors in a row direction.

21. The method of claim 20 forming the conductor line to have a top that is lower than a top of the channel region of the transistor-material lines that are on both lateral sides of the conductor line.

22. The method of claim 20 forming the conductor line to have a top that is elevationally-coincident with a top of the channel region of the transistor-material lines that are on both lateral sides of the conductor line.

23. The method of claim 20 wherein the cutting is not completely through the transistor material of the transistor-material lines thus leaving a continuous line of the transistor material running horizontally below and from which the first pillars upwardly project, the continuous line comprising the lower source/drain region of the individual transistors.

24. The method of claim 20 comprising forming the conducting material to be directly against a lateral side of the conductor line in a finished construction.

25. The method of claim 20 comprising forming the conducting material to be directly against a top of the conductor line in a finished construction.

26. A method of forming an array of vertical transistors, comprising:
- forming laterally-spaced and horizontally-elongated lines comprising transistor material, the transistor material comprising a channel region of what will be individual vertical transistors;
- lining lateral sides of trenches that are between the transistor-material lines with insulative material;
- forming a horizontally-elongated conductor line in individual of the insulative-material-lined trenches between immediately-laterally-adjacent of the transistor-material lines;
- vertically recessing the insulative material to have tops that are lower than a top of the conductor line there-between thereby forming a vertical recess that is laterally-between the conductor line and the channel region of the immediately-laterally-adjacent transistor-material lines on each lateral side of the conductor line;
- forming conducting material in the vertical recess on each said lateral side of the conductor line and that directly electrically couples the conductor line to the channel region of the immediately-laterally-adjacent transistor-material lines on each lateral side of the conductor line;
- cutting the transistor-material lines to form spaced pillars individually comprising the channel region of the individual vertical transistors, the conductor line directly electrically coupling together individual of the channel regions of the pillars of a plurality of the vertical transistors; and
- forming an upper source/drain region above the individual channel regions of the pillars, a lower source/drain region below the individual channel regions of the pillars, and a conductive gate line operatively aside the individual channel regions of the pillars and that interconnects multiple of the vertical transistors.

27. The method of claim 26 wherein the cutting is not completely through the transistor material of the transistor-material lines thus leaving a continuous line of the transistor material running horizontally below and from which the pillars project upwardly.

28. The method of claim 26 comprising cutting the conductor line to form spaced conductive pillars projecting upwardly from a continuous line of conductor material of the conductor line.

29. The method of claim 26 comprising forming the conductor line and the conductive gate line to be angled relative one another.

* * * * *